US009157970B2

(12) United States Patent
Fyie et al.

(10) Patent No.: US 9,157,970 B2
(45) Date of Patent: Oct. 13, 2015

(54) METHOD AND APPARATUS FOR PREVENTING CONTAMINATION FROM AFFECTING MAGNETIC FIELD SENSORS

(75) Inventors: Matthew Luke Fyie, Canton, MI (US); Gerard Patrick Kuchta, Grosse Pointe Park, MI (US); Steve Adam Hermann, Fenton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1021 days.

(21) Appl. No.: 13/080,125

(22) Filed: Apr. 5, 2011

(65) Prior Publication Data

US 2012/0256621 A1    Oct. 11, 2012

(51) Int. Cl.
*G01B 7/30*        (2006.01)
*G01R 33/07*     (2006.01)

(52) U.S. Cl.
CPC ..................... *G01R 33/072* (2013.01)

(58) Field of Classification Search
CPC ..................................................... G01R 33/072
USPC .......... 324/251, 207.25, 174, 207.21–207.23, 324/207.24, 207.26, 173, 179
See application file for complete search history.

(56) References Cited

U.S. PATENT DOCUMENTS

| | | | |
|---|---|---|---|
| 4,011,476 A | 3/1977 | Beard | |
| 4,103,155 A * | 7/1978 | Clark | 250/231.13 |
| 4,268,771 A * | 5/1981 | Lace | 310/155 |
| 4,687,952 A * | 8/1987 | Capizzi, Jr. | 327/227 |
| 4,700,133 A * | 10/1987 | Day | 324/207.15 |
| 4,746,791 A * | 5/1988 | Forkel | 250/231.13 |
| 4,867,011 A | 9/1989 | Garrett | |
| 4,920,797 A | 5/1990 | Swartz et al. | |
| 5,032,790 A * | 7/1991 | Johnson | 324/174 |
| 5,045,920 A | 9/1991 | Vig et al. | |
| 5,510,708 A * | 4/1996 | Shirai et al. | 324/174 |
| 5,541,506 A * | 7/1996 | Kawakita et al. | 324/207.2 |
| 5,581,179 A | 12/1996 | Engel et al. | |
| 5,625,289 A * | 4/1997 | Daetz et al. | 324/207.14 |
| 5,631,556 A * | 5/1997 | Shibata | 324/174 |
| 5,670,873 A * | 9/1997 | Onishi et al. | 324/174 |
| 5,747,987 A * | 5/1998 | Smith | 324/207.13 |
| 5,963,028 A | 10/1999 | Engel et al. | |
| 6,265,865 B1 | 7/2001 | Engel et al. | |
| 6,533,072 B2 | 3/2003 | Hori | |
| 6,791,334 B2 | 9/2004 | Horie et al. | |

(Continued)

FOREIGN PATENT DOCUMENTS

FR           2925139        6/2009

OTHER PUBLICATIONS

The Free Online Dictionary, p. 1.*

*Primary Examiner* — Patrick Assouad
*Assistant Examiner* — Demetrius Pretlow
(74) *Attorney, Agent, or Firm* — Diederiks & Whitelaw, PLC

(57) ABSTRACT

A magnetic field sensor is employed to determine a rotational velocity of an element by sensing frequency variations in a magnetic flux during rotation of the element. The magnetic field sensor includes a sensor face provided with obstacles, such as a series of spaced, substantially parallel grooves arranged perpendicular to a direction in which contamination tends to move across the face during operation of the sensor. The obstacles inhibit movement of contamination across the face such that the contamination does not cause false variations in the magnetic flux which would degrade sensor signals.

22 Claims, 6 Drawing Sheets

(56) References Cited

U.S. PATENT DOCUMENTS

| | | | |
|---|---|---|---|
| 6,879,151 B2 * | 4/2005 | Iwase et al. | 324/207.25 |
| 7,083,537 B2 | 8/2006 | Knowles et al. | |
| 7,423,420 B2 * | 9/2008 | Meyersweissflog | 324/174 |
| 7,608,346 B2 * | 10/2009 | Braun et al. | 428/692.1 |
| 7,655,319 B2 | 2/2010 | Babin | |
| 7,760,080 B2 | 7/2010 | Breed et al. | |
| 7,777,481 B2 * | 8/2010 | Singh et al. | 324/207.15 |
| 7,816,772 B2 | 10/2010 | Engel et al. | |
| 7,872,470 B2 * | 1/2011 | Booth et al. | 324/207.2 |
| 8,299,807 B2 * | 10/2012 | Sakamaki et al. | 324/663 |
| 2002/0196014 A1 * | 12/2002 | Iwase et al. | 324/207.2 |
| 2004/0130314 A1 * | 7/2004 | Bossoli et al. | 324/174 |
| 2005/0089082 A1 * | 4/2005 | Anderson et al. | 374/208 |
| 2005/0127904 A1 * | 6/2005 | Tawara | 324/207.13 |
| 2006/0082365 A1 * | 4/2006 | Hudson et al. | 324/207.25 |
| 2008/0086240 A1 | 4/2008 | Breed | |
| 2009/0001965 A1 * | 1/2009 | Ausserlechner et al. | 324/202 |
| 2010/0013463 A1 * | 1/2010 | Ozaki et al. | 324/207.2 |
| 2010/0126251 A1 | 5/2010 | Pileggi et al. | |
| 2010/0330708 A1 | 12/2010 | Engel et al. | |
| 2011/0185801 A1 * | 8/2011 | Johannsen et al. | 73/115.08 |
| 2011/0204888 A1 * | 8/2011 | Han | 324/251 |

* cited by examiner

METHOD AND APPARATUS FOR PREVENTING CONTAMINATION FROM AFFECTING MAGNETIC FIELD SENSORS

BACKGROUND OF THE INVENTION

1. Field of the Invention

The present invention pertains to the art of sensors and, more particularly, to magnetic field sensors, such as Hall effect sensors, employed in measuring a rotational velocity of an element in environments where contamination is present, particularly ferrous contamination such as in automatic transmissions.

2. Discussion of the Prior Art

Magnetic field sensors are widely used to sense relative motion between objects, generally by detecting a change in magnetic flux. For instance, when it is desired to sense the rotational speed or position of a rotational shaft, a trigger wheel or disk is often mounted to the shaft and the wheel is provided with surface features for causing variations in magnetic flux. Typically, a magnet is provided to generate the magnetic flux and a sensor is placed opposite the trigger wheel. As the trigger wheel moves, the sensor will produce a signal with a strength that varies based on the strength of the sensed magnetic field. The signal inherently has a waveform that correlates to the shape and spacing of the surface features and the speed of rotation of the wheel and attached shaft. As such, the rotational speed and position of the shaft can be determined from the signal's waveform.

A typical Hall effect sensor is described in U.S. Pat. No. 7,816,772. As shown in FIG. 1 of the '772 patent, a Hall effect sensor includes a Hall IC having first and second Hall elements disposed on a leadframe. A concentrator is disposed on the other side of leadframe opposite the Hall elements. A magnet is connected to the concentrator and the whole assembly is over-molded with plastic. The sensor is placed in proximity to a gear with teeth that change the magnetic flux caused by the magnet as the gear rotates. While such sensors are perfectly adequate in most circumstances, problems develop when they are used in environments that contain ferrous contamination such as that found within an automatic transmission.

Automatic transmissions provide multiple speed ratios between an input from an engine and an output to driving wheels of a vehicle. Usually, an automatic transmission contains a torque converter arrangement with an impeller, a stator and a turbine. Power generated in an engine is directed to the impeller, transferred to the turbine and then exits the turbine through a turbine output shaft. Therefore, the turbine output shaft leads to a series of planetary gearsets which provide multiple speed ratios by using clutches and brakes to connect or brake different parts of the planetary gearsets to establish each desired rotational speed ratio. Power exits the transmission via a transmission output shaft and ultimately proceeds to the driving wheels. Hall effect rotational speed sensors are used in transmissions to measure the rotational speeds of parts of the transmission for several reasons, for example, controlling shifts from one rotational speed ratio to another. Measuring the speed of the turbine shaft and the transmission output shaft are particularly useful in controlling shift changes. A signal from the Hall effect rotational speed sensor is sent to a transmission control system which directs the speed and timing of engagement of the appropriate clutches or brakes to change rotational speed ratios while minimizing shift shock.

Automatic transmissions generate heat and need lubrication. To address these requirements, the transmission components, such as the torque converter and planetary gearsets, are mounted in a housing and a combination of lubricating and cooling oil is circulated around the various transmission components. Through natural wearing, small ferrous objects, such as metal pieces or filings, collect in the transmission casing. Hall effect rotational speed sensors mounted in the transmission casing and positioned to measure rotational shaft speed are sometimes affected by the ferrous contamination. Specifically, small particles of ferrous contamination are attracted by the magnet in the Hall effect sensor and position themselves on the face of the sensor. For example, again utilizing the arrangement disclosed in U.S. Pat. No. 7,816,772 as an example, ferrous contamination can develop between the gear teeth and the Hall effect sensor resulting in the Hall elements producing false readings, in addition to the signals produced as each tooth passes the sensor. The ferrous particles actually move across the face of the sensor as the particles follow the teeth. The false readings trigger a fault in the control system for the transmission and result in the vehicle being brought in for repair at a vehicle dealership.

A graph 1 showing output signals including a square wave signal 2 and an analog signal 4 from such a sensor is shown in FIG. 6. Note particularly that, instead of producing a regular pattern at a constant sensed velocity, square wave signal 2 exhibits dropouts 6 and duty cycle irregularities 8, while analog signal 4 shows irregularities 9. A mechanic usually wipes the sensor clean and/or replaces the sensor, thus temporally stopping the fault. Customers and repair facilities often spend much time and expense replacing sensors only to find the next sensor is affected by another collection of ferrous particles.

Based on the above, there exists a need in the art for a rotational speed sensor that is able to operate in an environment containing contamination while overcoming some or all of the above-mentioned shortcomings of the prior art.

SUMMARY OF THE INVENTION

The present invention is directed to a magnetic field sensor for measuring a rotational velocity of an element, such as a rotatable shaft, in environments where contamination, particularly ferrous contamination, is present. In a preferred embodiment, a magnet is provided for creating a magnetic flux in which frequency variations are developed during rotation of a shaft. The magnet is preferably part of a magnetic field or Hall effect sensor adapted to convert frequency variations in the magnetic flux into a pulsating DC electrical signal. The magnetic field sensor includes a sensor face spaced from the rotating shaft by a gap.

With this arrangement, rotation of the shaft causes variations in the magnetic flux having a frequency proportional to the angular velocity of the rotating shaft. More specifically, the rotating shaft is provided with structure, such as a trigger wheel with regularly spaced undulations or teeth, on an outer periphery thereof for this purpose. This same structure also tends to move the contamination in a first direction along the sensor face. However, in accordance with the invention, the sensor face is provided with obstacles, such as grooves arranged substantially perpendicular to the first direction, for preventing movement of the contamination across the face whereby the contamination does not cause false variations in the magnetic flux which would degrade the electrical signal produced by the magnetic field sensor. The grooves are preferably formed with side walls that form a "V" or "U" shape, with the grooves being preferably formed in a molding process. In the "U" shape configuration, each groove is also formed with a bottom wall positioned at a substantially right angle relative to the side walls.

The invention is also directed to a method for preventing contamination from affecting the sensitivity of a magnetic field sensor in environments where ferrous or other contamination is present while measuring a rotational velocity of an element. The method includes: creating a magnetic flux; causing frequency variations in the magnetic flux proportional to the angular velocity of the rotating element; passing the magnetic flux through a face of a magnetic field sensor; converting the variations in the magnetic flux into an electrical signal; and preventing movement of the contamination across the face to minimize false variations in the magnetic flux which would degrade the electrical signal produced by the magnetic field sensor.

Additional objects, features and advantages of the present invention will become more readily apparent from the following detailed description of preferred embodiments when taken in conjunction with the drawings wherein like reference numerals refer to corresponding parts in the several views.

DETAILED DESCRIPTION OF THE PREFERRED

Embodiments

Figure 1:
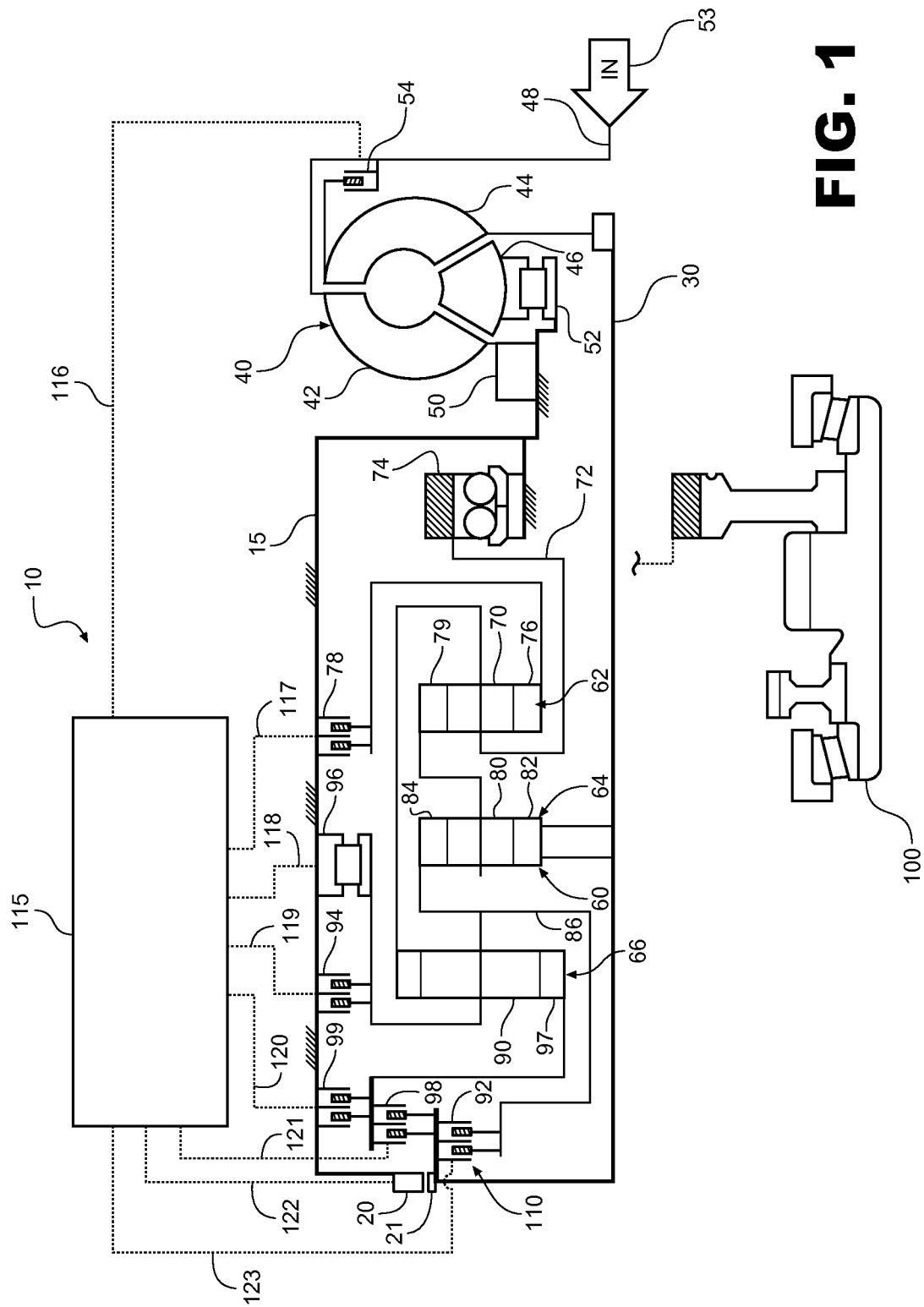
FIG. 1 is a schematic diagram of an automatic transmission incorporating a rotational speed sensor in accordance with the invention.

With initial reference to FIG. 1, there is shown an automatic transmission 10 of a motor vehicle having six forward gear ratios and one reverse ratio. Transmission 10 has a housing 15 containing a signal generator in the form of a magnetic field sensor 20 for measuring a rotational velocity of a rotating turbine shaft 30. A trigger wheel 21 is positioned near sensor 20 and is attached to a turbine shaft 30. A hydrokinetic torque converter 40 has an impeller 42, a turbine 44 and a stator 46 all arranged in a toroidal flow path. Impeller 42 is connected directly to an engine crankshaft 48 and thus rotates in a direction determined by crankshaft 48. Impeller 42 is also connected to an oil pump 50 that pumps oil throughout housing 15. Stator 46 is anchored against rotation in a direction opposite to the direction of rotation of impeller 42 by a one-way brake 52. Torque, represented by arrow 53, may be transmitted from crankshaft 48 to impeller 42, across converter 40 to turbine 44, and then to turbine shaft 30 or may bypass converter 40 by passing through a lockup clutch 54. In either case, torque 53 then travels into a planetary gear system generally indicated at 60.

In the exemplary embodiment shown, planetary gear system 60 includes three planetary gearset units 62, 64 and 66. Planetary gearset unit 62 has a carrier 70 connected through an intermediary shaft 72 to an output gear 74; a sun gear 76 connected to a forward brake 78; and ring gear 79. Planetary gearset unit 64 has a carrier 80 connected to ring gear 79; a sun gear 82 connected to turbine shaft 30; and a ring gear 84 connected to a reaction shaft 86. Planetary gearset unit 66 has a carrier 90 that is connected to reaction shaft 86 and thus directly to ring gear 84 and an overdrive/drive clutch 92. Carrier 90 is also connected to a low/reverse brake 94 and a one-way brake 96. Gearset 66 also has a sun gear 97 connected to a direct drive clutch 98 and an intermediate brake 99. In addition to being connected to sun gear 82, turbine shaft 30 is also connected to overdrive/drive clutch 92 and direct drive clutch 98. Output gear 74 is connected to a separate output assembly 100 which, in turn, is connected to driving wheels (not shown).

Automatic transmission 10 also includes friction element assembly 110 having six selectively engaged friction elements: overdrive/drive clutch 92; drive clutch 98; intermediate brake 99; low/reverse brake 94; forward brake 78; and one-way brake 96. Friction element assembly 110 is connected to a transmission controller 115. More specifically, transmission controller 115 is linked to lock-up clutch 54 by a control line 116 and friction element assembly 110 by several control lines 117-123. Controller 115 ensures that the six selectively engaged friction elements follow a specific engagement and release pattern to establish the six forward and one reverse gear ratios of this particular transmission. Overdrive/drive clutch 92 is engaged in gears 4-6 and drive clutch 98 is engaged in gears 3, 5 and reverse. Intermediate brake 99 is engaged in gears 2 and 6, low/reverse brake is engaged in gears 1 and reverse, and forward brake is engaged in gears 1-4. Finally, one-way brake 96 brakes in first gear, overruns in gears 1-6 and is not active in reverse. Controller 115 activates the friction elements at different times and speeds of engagement based in part on the speed of turbine shaft 30 and, more specifically, based on a signal received from sensor 20 through control line 122. At this point, it should be recognized that transmission assembly 10 has been described in detail for the sake of completeness. However, it should be understood that transmission assembly 10 represents only an exemplary application of the invention which is particularly directed to preventing contamination from affecting Hall effect sensors employed in any environment were ferrous contamination is present as more specifically described below.

Figure 2:
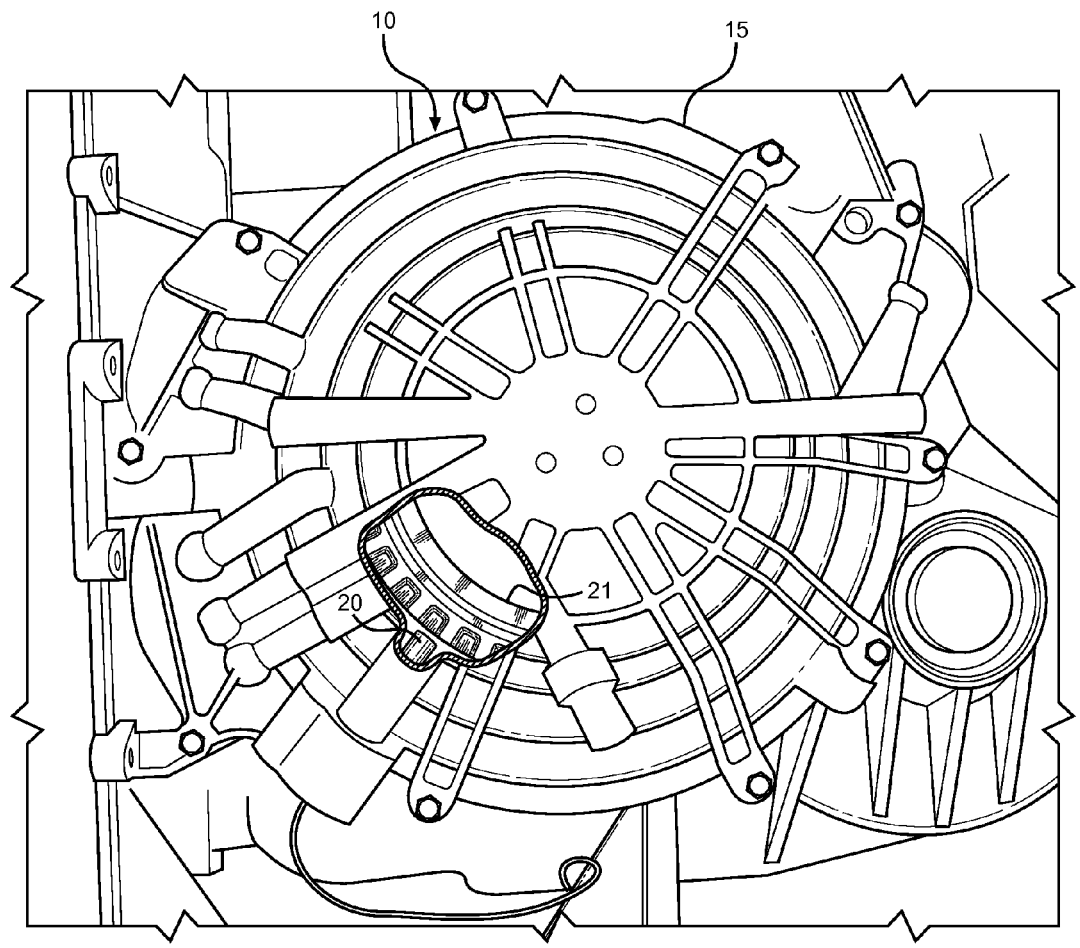
FIG. 2 is a cut-away view showing the rotational speed sensor of FIG. 1 mounted in the transmission.
Figure 3:
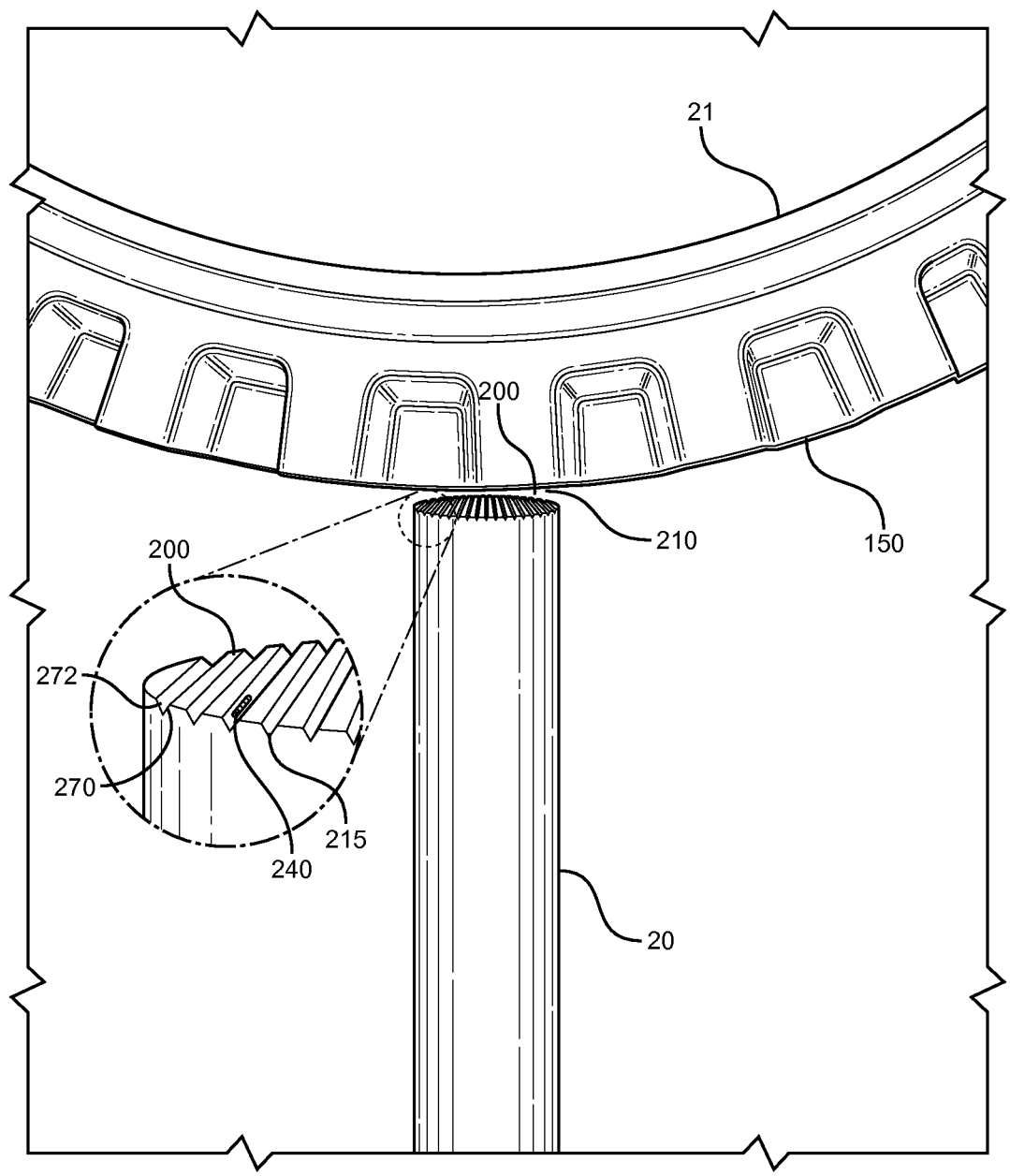
FIG. 3 is a close-up perspective view of the speed sensor of FIG. 2 showing "V" shaped grooves on the sensor in accordance with a first preferred embodiment of the invention.
Figure 5:
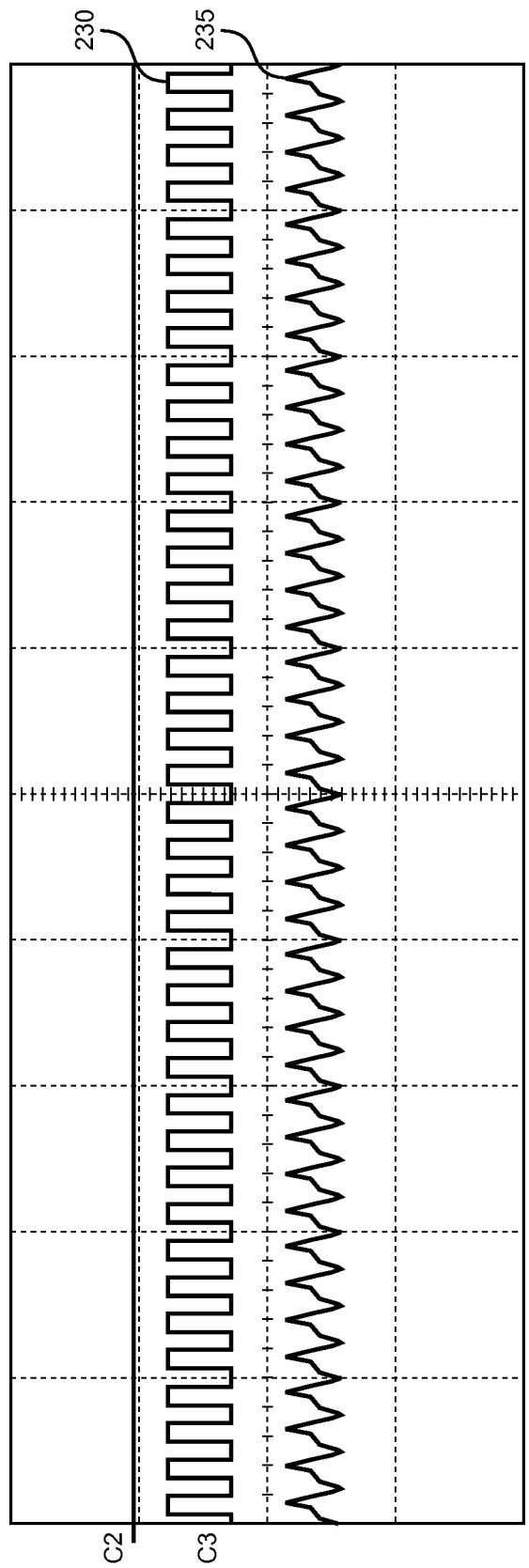
FIG. 5 is a graph showing an output signal from the rotational speed sensor of FIG. 1.
Figure 6:
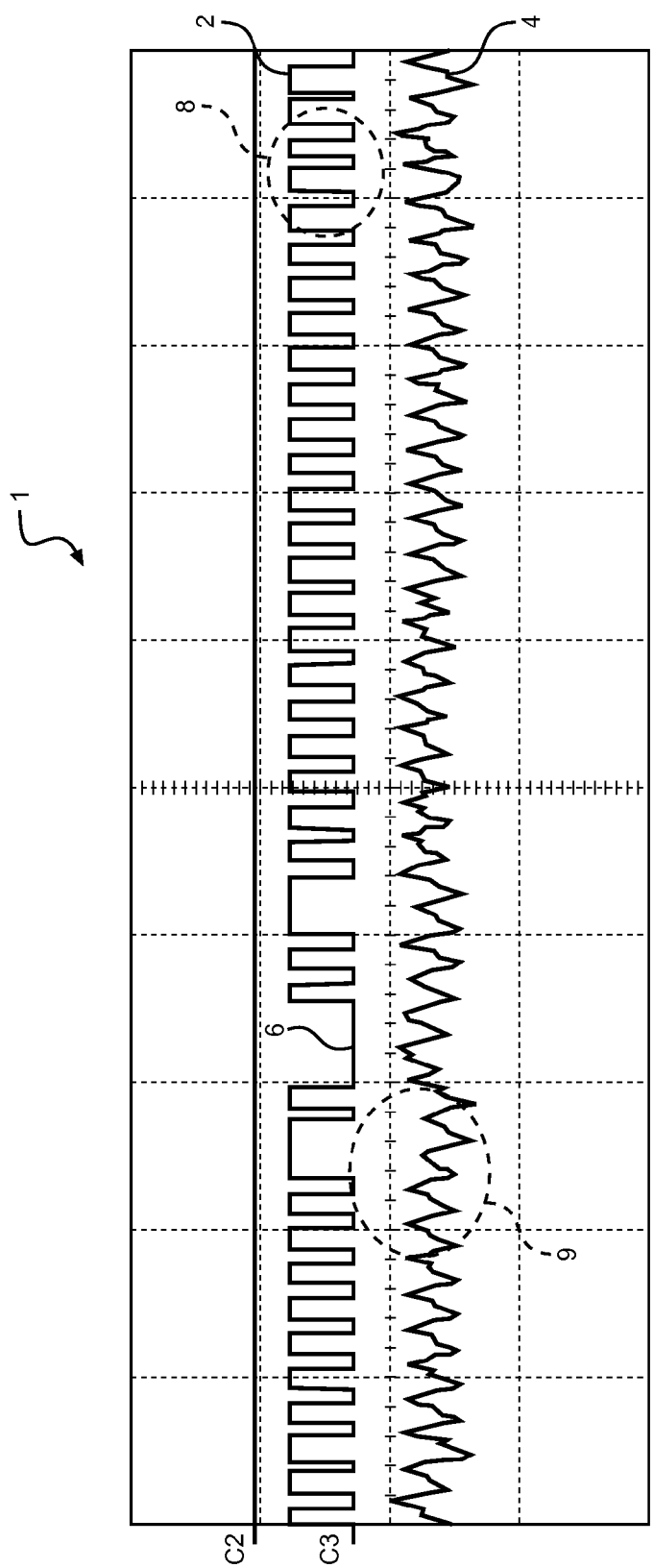
FIG. 6 is a graph showing an output signal from a prior art rotational speed sensor.

Turning now to FIG. 2, there is shown an end view of transmission 10 with transmission housing 15 being shown cut-away to illustrate the relative position of sensor 20 and trigger wheel 21. As mentioned above, trigger wheel 21 is mounted for rotation with shaft 30. Trigger wheel 21 is preferably connected directly to shaft 30, but may also be connected to any rotating member of transmission 10 that rotates at the same speed as shaft 30 or rotates at a speed proportional to the speed of shaft 30. As shown best in FIGS. 3 and 4, trigger wheel 21 includes structure 150 for causing variations in magnetic flux that have a frequency proportional to the angular velocity of rotating shaft 30. In general, trigger wheel 21 can be formed with various structure 150 which would cause the desired variation in magnetic flux, including undulations (shown) and teeth (not shown). Sensor 20 including a sensor face 200 spaced from trigger wheel 21 by a gap 210. Magnetic field sensor 20 is configured to convert variations in magnetic flux developed by rotation of shaft 30 and trigger wheel 21 into a pulsating DC electrical signal, such as square wave signal 230 or analog signal 235 as shown in FIG. 5. Sensor face 200 is provided with obstacles 215, shown here in the form of a series of spaced, substantially parallel grooves or recessed regions, for preventing movement of contamination 240, such as chips, shavings, filings, slivers or the like of ferrous or other metals, across face 200 whereby contamination 240 does not cause false variations in the magnetic flux which would degrade the electrical signal as discussed above with reference to FIG. 6.

Figure 4:
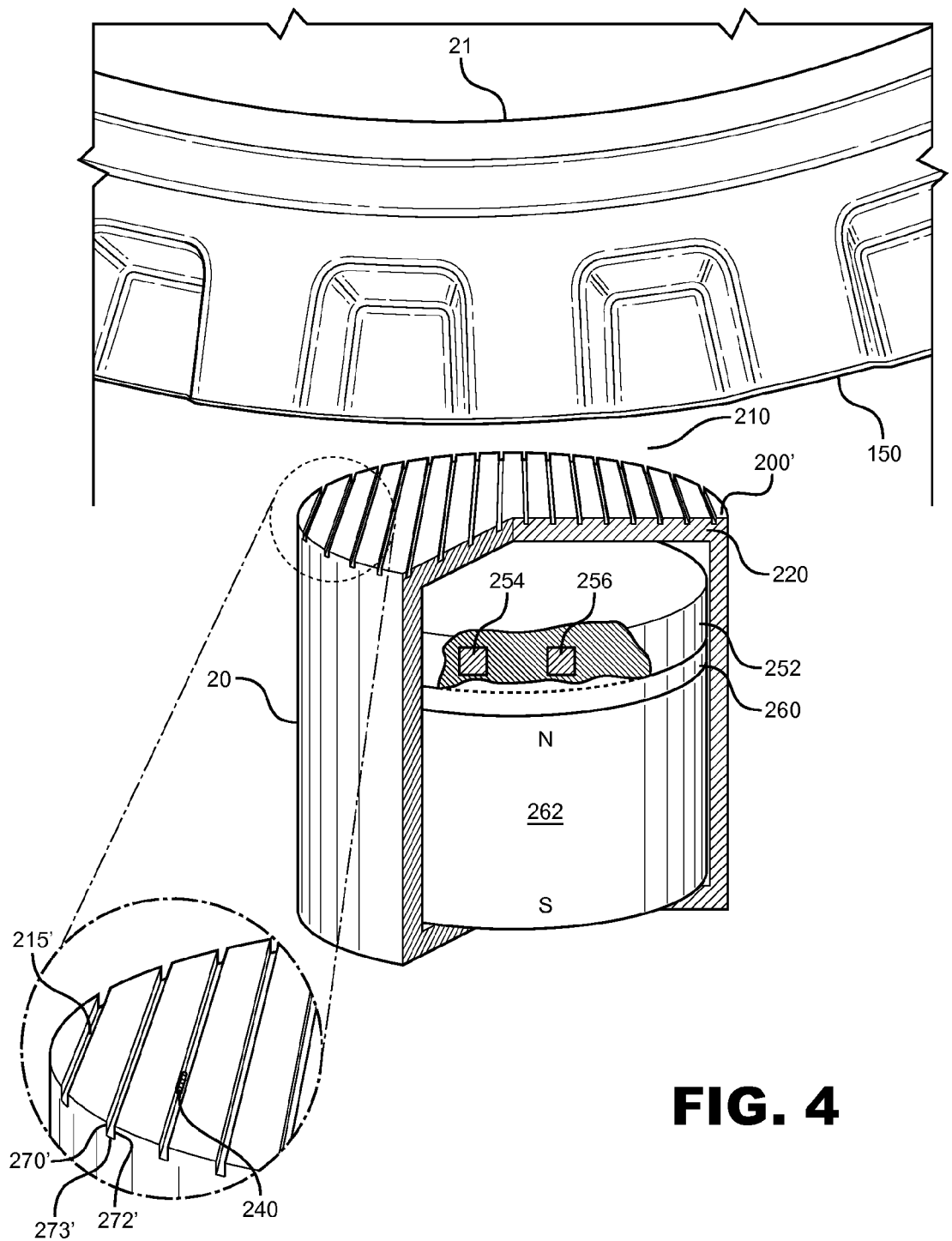
FIG. 4 is a close-up perspective view of a speed sensor showing "U" shaped grooves on the sensor in accordance with a second preferred embodiment of the invention.

As best seen in the embodiment of FIG. 4, magnetic field sensor 20 preferably constitutes a Hall effect sensor including an integrated circuit layer 252 that contains first and second Hall elements 254 and 256. A concentrator 260 is located below the integrated circuit layer 252 and a magnet 262 is located below concentrator 260. Sensor 20 is formed by an over-molding process, such as described in U.S. Pat. No. 7,816,772, incorporated herein by reference.

Since trigger wheel 21 tends to move contamination 240 in a first direction generally corresponding to the direction of motion of structure 150, obstacles 215 are arranged substantially perpendicular to the first direction. Preferably, obstacles 215 are formed with two side walls 270 and 272. In accordance with a first preferred embodiment shown in FIG. 3, each of the obstacles 215 is V-shaped groove while in a second preferred embodiment shown in FIG. 4, each of obstacles 215' is U-shaped groove. More specifically, in the FIG. 4 embodiment, each groove 215' is formed with a bottom wall 273 formed at a right angle relative to side walls 270', 272'. As with sensor 20 overall, grooves 215, 215' are preferably formed in a molding process. In any case, with this arrangement, contamination 240 is trapped by obstacles 215, 215', thus preventing relative motion between contamination 240 and sensor 20. Without such relative motion, sensor 20 produces a clear output signal, such as signals 230, 235 shown in FIG. 5 and therefore sensor 20 is able to work properly in an environment that contains contamination 240.

While described with reference to preferred embodiments, it should be readily understood that various changes and/or modifications can be made to the invention without departing from the spirit thereof. For instance, while the described obstacles are constituted by grooves or recessed regions which preferably extend in a particular direction, the obstacles may take on several different shapes, including walls, numbs, bumps or other raised elements, so long as they prevent relative motion of the ferrous or other potentially obstructing contamination versus the face of the sensor. Also, the magnet could be located separately from the sensor and in any position that allows the magnet to create a magnetic flux that is disturbed upon movement of the rotating element. Finally, it should be realized that the invention has applicability in connection with measuring rotational velocity of numerous objects, whether in a motor vehicle transmission, any other power transmission unit having a power source and a rotatable element, or otherwise. In general, the invention is only intended to be limited by the scope of the following claims.

We claim:

1. A power transmission unit comprising:
    a rotatable element for transmitting power through the power transmission unit;
    a magnet for creating a magnetic flux that develops frequency variations proportional to a rotational velocity of the rotatable element; and
    a magnetic field sensor configured to sense the frequency variations and including:
        a sensor face provided with obstacles, wherein the obstacles constitute a series of grooves formed in the sensor face for preventing movement of contamination across the sensor face, and
        a sensor element located between the magnet and the sensor face,
    wherein contamination is caused to move in a first direction across the sensor face during rotation of the rotatable element, said obstacles being arranged in a second direction that is different from the first direction to inhibit movement of contamination across the sensor face so as to minimize false frequency variations in the magnetic flux.

2. The power transmission unit of claim 1, wherein the grooves are U-shaped or V-shaped, and further wherein the series of grooves are spaced from and parallel to each other across the sensor face.

3. The power transmission unit of claim 1, wherein the magnetic field sensor constitutes a Hall effect sensor including the magnet, and wherein the sensor element is a Hall element.

4. The power transmission unit of claim 3, wherein the Hall element is located entirely below the sensor face, and further comprising:
    a protective covering for the Hall effect sensor, the sensor face forming a portion of the protective covering.

5. The power transmission unit of claim 1, wherein the magnetic field sensor is configured to convert the frequency variations in the magnetic flux into a pulsating DC electrical signal.

6. The power transmission unit of claim 1, wherein the second direction is perpendicular to the first direction.

7. The power transmission unit of claim 1, wherein the sensor element is located entirely below the sensor face, and further comprising:
    a protective covering for the magnetic field sensor, the sensor face forming a portion of the protective covering.

8. The power transmission unit of claim 1, wherein the obstacles are arranged to inhibit movement of contamination across the sensor face so as to minimize false frequency variations in the magnetic flux caused by movement of contamination relative to the sensor element.

9. A magnetic field sensor comprising:
    a sensor face provided with obstacles, wherein the obstacles constitute a series of grooves formed in the sensor face for preventing movement of contamination across the sensor face;
    a magnet; and
    a sensor element located between the magnet and the sensor face;
    wherein the magnetic field sensor is configured to sense variations in a magnetic flux; and
    wherein contamination is caused to move in a first direction across the sensor face, the obstacles being arranged in a second direction that is different from the first direction so as to inhibit movement of the contamination across the sensor face to minimize false variations in the magnetic flux.

10. The magnetic field sensor of claim 9, wherein the grooves are U-shaped or V-shaped, and further wherein the series of grooves are spaced from and parallel to each other across the sensor face.

11. The magnetic field sensor of claim 9, wherein the magnetic field sensor is configured to convert variations in the magnetic flux into a pulsating DC electrical signal, with the obstacles preventing movement of contamination across the sensor face to minimize false variations in the magnetic flux which would degrade the electrical signal.

12. The magnetic field sensor of claim 9, wherein the sensor element is a Hall element.

13. The magnetic field sensor of claim 12, wherein the Hall element is located entirely below the sensor face, and further comprising:

a protective covering, the sensor face forming a portion of the protective covering.

14. The magnetic field sensor of claim 9, wherein the second direction is perpendicular to the first direction.

15. The magnetic field sensor of claim 9, wherein the sensor element is located entirely below the sensor face, and further comprising:
   a protective covering, the sensor face forming a portion of the protective covering.

16. The magnetic field sensor of claim 9, wherein the obstacles are arranged to inhibit movement of contamination across the sensor face so as to minimize false frequency variations in the magnetic flux caused by movement of contamination relative to the sensor element.

17. A method of measuring a rotational velocity of an element comprising:
   creating a magnetic flux with a magnet;
   causing frequency variations in the magnetic flux proportional to the rotational velocity of the element;
   passing the magnetic flux through a face of a magnetic field sensor;
   converting the variations in the magnetic flux into an electrical signal by employing a sensor element located between the face and the magnet; and
   preventing movement of contamination across the face to minimize false variations in the magnetic flux which would degrade the electrical signal, wherein contamination is caused to move across the face of the magnetic field sensor in a first direction, wherein preventing movement of the contamination includes providing grooves in the face of the magnetic field sensor and wherein providing the grooves includes positioning the grooves in a second direction that is different from the first direction.

18. The method of claim 17, wherein the magnet is provided in the magnetic field sensor and the sensor element is a Hall effect element.

19. The method of claim 18, further comprising:
   locating the Hall effect element entirely below the face; and
   providing a protective covering for the magnetic field sensor, the face forming a portion of the protective covering.

20. The method of claim 17, wherein positioning the grooves in a second direction that is different from the first direction includes positioning the grooves in a direction that is perpendicular to the first direction.

21. The method of claim 17, further comprising:
   locating the sensor element entirely below the face; and
   providing a protective covering for the magnetic field sensor, the face forming a portion of the protective covering.

22. The method of claim 17, wherein preventing movement of contamination across the face includes preventing movement of contamination across the face to minimize false frequency variations in the magnetic flux caused by movement of contamination relative to the sensor element.

* * * * *